US012702010B2

(12) United States Patent
Bayat

(10) Patent No.: US 12,702,010 B2
(45) Date of Patent: Aug. 4, 2026

(54) RADIATION SHIELDING OF ELECTRONICS USING ARTIFICIALLY CREATED MAGNETIC FIELDS

(71) Applicant: MENTIUM TECHNOLOGIES INC., Santa Barbara, CA (US)

(72) Inventor: Farnood Merrikh Bayat, Goleta, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 490 days.

(21) Appl. No.: 18/482,751

(22) Filed: Oct. 6, 2023

(65) Prior Publication Data

US 2024/0120290 A1    Apr. 11, 2024

Related U.S. Application Data

(60) Provisional application No. 63/414,104, filed on Oct. 7, 2022.

(51) Int. Cl.
*H05K 9/00* (2006.01)
*H10W 42/20* (2026.01)
(52) U.S. Cl.
CPC .......... *H10W 42/20* (2026.01); *H05K 9/0071* (2013.01)

(58) Field of Classification Search
CPC ..................................................... H05K 9/0071
See application file for complete search history.

(56) References Cited

U.S. PATENT DOCUMENTS

| | | | |
|---|---|---|---|
| 10,011,372 B2 * | 7/2018 | Dong ..................... | B64G 1/546 |
| 2002/0074647 A1 * | 6/2002 | Wolf ..................... | H10W 40/25 |
| | | | 257/E23.114 |
| 2016/0204073 A1 * | 7/2016 | Beak ..................... | H10W 42/20 |
| | | | 118/313 |
| 2022/0117124 A1 * | 4/2022 | Kim ......................... | H01F 27/36 |
| 2022/0246540 A1 * | 8/2022 | Shi ......................... | H10W 42/20 |
| 2022/0270982 A1 * | 8/2022 | Miao ..................... | H10W 42/20 |
| 2023/0056509 A1 * | 2/2023 | Rajoo ..................... | H10D 1/20 |

* cited by examiner

*Primary Examiner* — Hung V Ngo
(74) *Attorney, Agent, or Firm* — Maschoff Brennan

(57) ABSTRACT

A semiconductor chip radiation shielding system may include a computing device including a semiconductor chip and a voltage supply that is configured to provide a supply voltage. The semiconductor chip radiation shielding system may include a solenoid that generates a magnetic field covering the computing device to prevent energetic radiation particles from affecting performance of the semiconductor chip included in the computing device. The supply voltage provided by the voltage supply may be applied across the solenoid to pass current through the solenoid, resulting in the solenoid generating the magnetic field around the semiconductor chip.

18 Claims, 3 Drawing Sheets

RADIATION SHIELDING OF ELECTRONICS USING ARTIFICIALLY CREATED MAGNETIC FIELDS

The present disclosure generally relates to radiation shielding of electronics using artificially created magnetic fields.

BACKGROUND

Semiconductor chip performance may be affected when the semiconductor chip is exposed to radiation. The two main effects of radiation on semiconductors are Single Event Effects (SEE) and Total Ionizing Dose Effects (TID). While the former often has a transient effect on the silicon chips, the latter may have a permanent impact on the semiconductor devices, which may eventually result in complete failure of the semiconductor devices. Due to these radiation effects, the use of semiconductor devices in space applications has become challenging. At the moment, multiple radiation mitigation techniques are incorporated in the silicon chips used in space applications, making their design and test procedure extremely costly and time consuming.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

The impact of radiation on semiconductor devices may be decreased or completely removed by creating and artificial magnetic field around the semiconductor chips. The created magnetic field may divert the ion particles preventing them from hitting the chip. Different methods, such as utilizing a solenoid, may be used to create a magnetic field, and the magnitude of the magnetic field may be adjusted based on the severity of the radiation in space.

To reduce the overall power consumption of the radiation shielding system, the solenoid or coil of wire may be placed in series with the main computing board so that the board current may also pass from the solenoid to create a larger magnetic field. The overall weight of the radiation shielding solution may be decreased by building the coil of wire using the metals usually used to shield semiconductor chips from radiation, such as aluminum. In such case, the solenoid may be used to both create the magnetic field and act as a shielding cover for the chip.

The object and advantages of the embodiments will be realized and achieved at least by the elements, features, and combinations particularly pointed out in the claims. It is to be understood that both the foregoing general description and the following detailed description are explanatory and are not restrictive of the invention, as claimed.

BRIEF DESCRIPTION OF THE DRAWINGS

Example embodiments will be described and explained with additional specificity and detail through the accompanying drawings in which.

DETAILED DESCRIPTION

Figure 1:
FIG. 1 illustrates an example of a radiation shielding system in which a solenoid wraps a semiconductor device and is directly connected to the supply VDD.

One or more embodiments of the present disclosure may include a coil of wire or solenoid wrapping a semiconductor chip to shield it from radiation effects like SEE and TID. The solenoid may be used to create a magnetic field around the chip to prevent or reduce the undesirable ion particles hitting the chip during operation. The amplitude of the generated magnetic field may be adjusted by the number of turns in the coil, the current passing through the coil or other methods. This method of radiation shielding may be used separately or in conjunction with other methods of radiation mitigation techniques.

In some embodiments, the material used to create the solenoid may be similar or identical to the material used currently to shield silicon devices from radiation in space. The material may have higher resistivity compared to other common materials like copper but by creating a compact solenoid the coil wires may play a dual-purpose function, i.e. both creating a magnetic field and shielding the chip using their own wire metals.

In some embodiments, the solenoid may be biased separately and independently from the underlying chip or board. In some other embodiments, the solenoid may be connected in series with the other chips and boards so the current consumed by the chips and boards may also pass through the solenoid. This makes the magnitude of the magnetic field proportional to the level of operation and computation happening in the chip. This may reduce the overall power consumption of the proposed radiation shielding method. If the voltage drop on the solenoid is considerable, the supply voltage may be increased to compensate the drop on the solenoid. In some embodiments, the input supply voltage may be higher than the voltage used by the chip and the voltage may be regulated to the chip voltage using a regulator after passing through a solenoid.

In some embodiments, the current passed through a solenoid may be adjusted based on the current taken by the circuits connected in series to the solenoid or based on the severity of the radiation. A separate circuit may be connected to the solenoid which may allow higher currents to pass through a solenoid to increase the magnetic field in environments with harsh radiation effects. The current passed through a solenoid may be reduced or removed when the chip is not operating or biased to save power.

In some embodiments, a filtering module may be placed between the solenoid and semiconductor chips to isolate the switching activities and noises of each side from the other side. As an example, a low-pass filter or decoupling capacitor may be added to smooth out the current drawn by the semiconductor chip or the boards.

A variable or programmable resistor may be connected in series with the solenoid to modulate the amount of current passing through the solenoid to adjust the magnitude of the generated magnetic field. The resistor may be mounted on the chip, the board, or the system so the generated heat can be used to heat up the system in the space.

The chip may be placed inside or outside of the solenoid. The chip may have any direction or orientation with respect to the solenoid which may be determined based on the direction of the radiation beams. The direction of chip with respect to the solenoid may be changed over time based on the direction at which the radiation is received.

Solenoid may have any arbitrary shape like circular, rectangular, etc. Any metal or compound may be used to build the solenoid. The exact dimensions of the solenoid like the radius or length may be proportional to the size of the chips being shielded and the severity of the radiation. Irregular, non-uniform, or non-linear solenoids may be used based on the actual geometry of the chip. The solenoid (from inside or outside) may be fully or partially immersed in a material with relative higher permeability than air. This may be done, for example, to better confine the magnetic field or to increase the magnetic field.

In some embodiments, a charge pump or batteries may be used to store the charge that can be later used to bias the solenoid when the chip is running any critical operation.

In some embodiments, the solenoid may be biased by the current coming out of the chip or the board.

In some other embodiments, chips may be mounted on two sides of the printed circuit board so both can be shielded from radiation using the same solenoid.

Currents of different systems on the spacecraft, mechanical or electrical, may be combined and passed through the radiation shielding solenoids covering critical electronics on the space craft to increase the generated magnetic fields and improve the level of radiation shielding.

Embodiments of the present disclosure are explained with reference to the accompanying figures.

FIG. 1 illustrates a block diagram of a semiconductor chip radiation shielding system 100 including a magnetic field generator solenoid 110 wrapped around or over the radiation-sensitive semiconductor chip 111 to protect it from the radiation effects during its operation. The solenoid may be biased using voltage supplies 101 and 102 to flow current 109 through the solenoid to generate magnetic fields around or over the semiconductor chip 111. To save power, the solenoid may be connected in series with the semiconductor chip 111 or a circuit board (not shown in the figure) so the chip or board current also passes through a solenoid to increase the generated magnetic field. Multiple chips may be connected in parallel to the chip voltages 103 and 107 and may be protected using the same solenoid 110.

In some embodiments, the semiconductor chip 111 may be included with or embedded in a computing device such that the semiconductor chip 111 is configured to perform one or more operations associated with the computing device. Additionally or alternatively, two or more semiconductor chips 111 may be mounted next to each other or on different sides of a printed circuit board so that the two or more semiconductor chips 111 are shielded from radiation by the same solenoid 110. Additionally or alternatively, a second, a third, or any number of solenoids may be included with the semiconductor chip radiation shielding system 100. For example, a second solenoid may be oriented in a second orientation direction different from a first orientation direction of the first solenoid 110 such that the semiconductor chip 111 of the device is shielded from incoming radiation from the second orientation direction and the first orientation direction.

Depending on the direction of the radiation, its magnitude, the geometry of the semiconductor chip 111, or any other properties of the semiconductor chip 111, the semiconductor chip 111 may be located inside or outside of the solenoid 110. Additionally or alternatively, the semiconductor chip 111 may have one direction or orientation aligned with respect to the direction or orientation of the solenoid 110.

A variable or programmable resistor 105 controlled through a control signal 106 may be used to increase the current passing through the solenoid 110 in case the current taken by the semiconductor chip 111 is not enough to generate an adequately strong magnetic field to shield the semiconductor chip 111 from radiation. In harsh radiation environments or in situations where the semiconductor chip 111 is performing a critical operation such as controlling the spacecraft or communicating to earth, the current 109 may be increased using the variable resistor 105 to strengthen the magnetic field. In situations in which the magnetic field may or may not be needed, or the chip current is enough to produce a magnetic field, the variable resistor may be disconnected using a switch 104 to save power.

To isolate the solenoid 110 and the semiconductor chip 111, a filtering circuit 108 may be inserted between the solenoid and the semiconductor chip 111 to prevent voltage or current spikes and noise from moving between the solenoid 110 and the semiconductor chip 111. The filtering circuit 108 may be a low-pass or high-pass filter. Additionally or alternatively, the filtering circuit 108 may be a circuit like a decoupling capacitor. A single filtering circuit 108 may be used to bias one or multiple semiconductor chips 111 or each semiconductor chip 111 may have its own filtering circuit 108. In some embodiments, the filtering circuit 108 may be a voltage regulator instead of or in addition to a filtering circuit to regulate the voltage received at the output of the solenoid 110 to the level used by the semiconductor chip 111. To compensate the voltage drop on the solenoid 110, the input voltage provided by the voltage supply 101 may be higher than the chip voltage 107 and the voltage regulator may be used to regulate the higher voltage level supplied by the voltage supply 101 to the lower voltage 107 while removing the noise and spikes on currents or voltages. In these and other embodiments, when multiple semiconductor chips 111 are connected to the same solenoid 110, multiple regulators may be used to regulate the common input voltage to the voltages used by different semiconductor chips 111.

The semiconductor chip 111 shown in FIG. 1 may be a single chip, a plurality of chips, or one or more boards. Different boards or systems may also be connected to the filtering circuit 108 to increase the current passing though the solenoid 110 to magnify the generated magnetic field to improve its radiation shielding.

The solenoid 110 may be built using iron, copper, aluminum, or any other material or compound. The semiconductor chip 111 may include separate radiation shielding and radiation mitigation techniques, such as protecting Static Random Access Memory chips (SRAMs) with Error Correcting Codes (ECC) or protecting sensitive circuits using Tripple Modular Redundancy (TMR) that may have been integrated inside the semiconductor chip 111. Tight wrapping of solenoid wires covering the surface of the semiconductor chip 111 may also act as a shielding of the semiconductor chip 111 against radiation.

The solenoid 110 and the semiconductor chip 111 may be biased separately using separate voltage sources if the power consumption is not an issue. The amplitude of input voltage provided by the voltage supply 101 may be increased to compensate the voltage drop across the solenoid 110. The solenoid 110 may have any size, shape, and geometry. The solenoid 110 may fully or partially cover the whole or part of the semiconductor chip 111. Any other methods of generating magnetic fields, linear or nonlinear, may be used instead of or in addition to the solenoid 110 to generate the radiation shielding magnetic fields.

The magnitude or duration of the generated magnetic field may be modulated based on the severity of the radiation, level of operation of the semiconductor chip 111, the importance of the computation performed within the semiconductor chip 111, or the sensitivity of the overall system to the operation of the particular semiconductor chip 111. For example, larger magnetic fields may be generated for critical circuits performing important operations, while the magnetic field may be turned off when the circuit or semiconductor chip 111 is not operating. As an additional or alternative example, a particular semiconductor chip 111 may be configured to perform operations that are relevant to operations of multiple aspects of a particular overall system such that a larger magnetic field may be generated to shield the particular semiconductor chip 111. As an additional or alternative example, an operating environment that includes low levels of radiation may involve a semiconductor chip 111 that is shielded by a relatively smaller magnetic field.

In some embodiments, a single or multiple solenoids 110 may be used together to protect a single or multiple semiconductor chips 111. The solenoids 110 may be arranged around the semiconductor chip 111 to protect the semiconductor chip 111 from radiation received from different directions. Multiple semiconductor chips 111 may be placed within a single solenoid 110 to be protected from the radiation.

Figure 2:
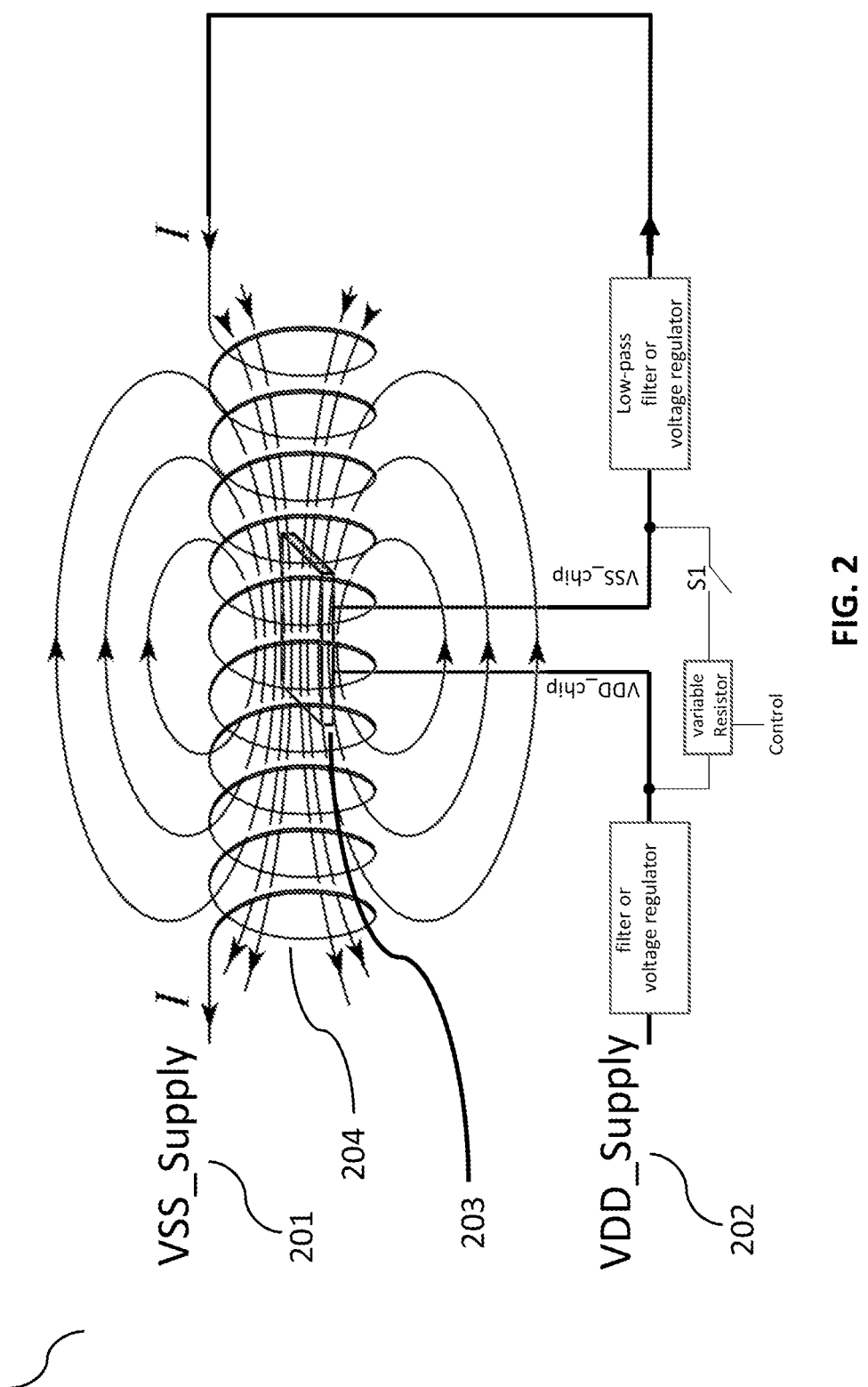
FIG. 2 illustrates an example of a radiation shielding system in which a solenoid wraps a semiconductor device and is directly connected to the supply VSS.

FIG. 2 illustrates a block diagram of a semiconductor chip radiation shielding system 200 which is similar to the radiation shielding system of FIG. 1 with the difference that a solenoid 204, which may be the same as or similar to the solenoid 110 of FIG. 1, is directly connected to a Voltage Source Supply (VSS, low voltage) 201 instead of a voltage drain-to-drain (VDD, high voltage) 202. In this and other radiation shielding systems, a semiconductor chip 203, which may be the same as or similar to the semiconductor chip 111 of FIG. 1, may be biased with an input voltage provided by the VSS 201, which may or may not be regulated, and the output current passes through the solenoid 204 to generate the magnetic field to shield the semiconductor chip 203.

Figure 3:
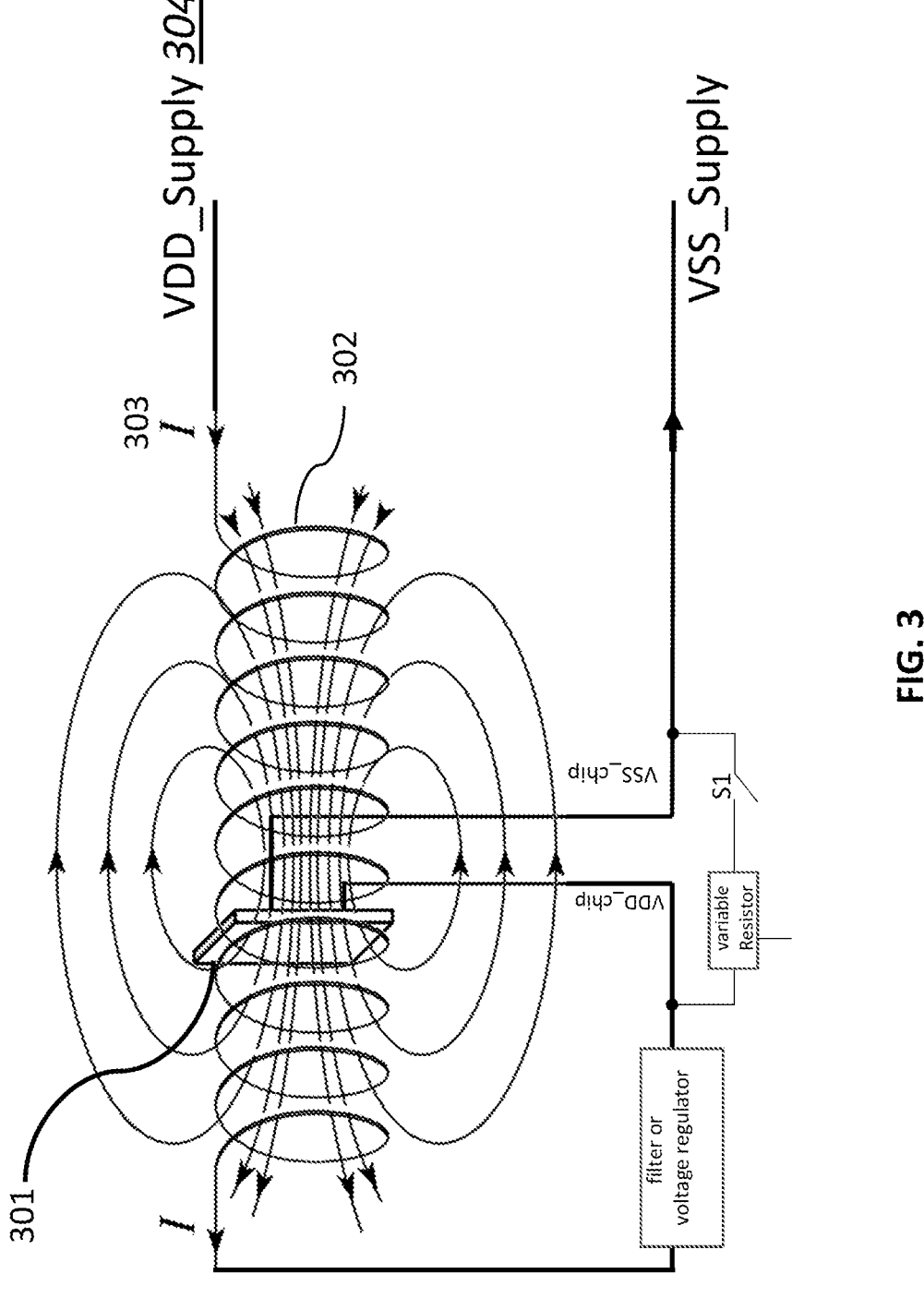
FIG. 3 illustrates an example of a radiation shielding system in which a solenoid wraps a semiconductor device in which a surface of the semiconductor device is perpendicular to the direction of the solenoid.

FIG. 3 illustrates a block diagram of a semiconductor chip radiation shielding system 300, which is similar to the radiation shielding system of FIG. 1, with the difference that a solenoid 302 that is the same as or similar to the solenoid 110 of FIG. 1 and the solenoid 204 of FIG. 2, and a semiconductor chip 301 that is the same as or similar to the semiconductor chip 111 of FIG. 1 and the semiconductor chip 203 of FIG. 2 have different orientations with respect to each other.

As illustrated in the semiconductor chip radiation shielding system 300, the semiconductor chip 301 may be oriented such that a length of the semiconductor chip 301 is perpendicular to a direction of a current 303 provided by a VDD supply 304 and a direction of wire coiling of the solenoid 302. Orienting the semiconductor chip 301 as depicted in the semiconductor chip radiation shielding system 300, as depicted in the semiconductor chip radiation shielding system 100, or according to any other orientations may improve radiation shielding depending on a direction or directions from which energetic radiation particles approach the semiconductor chip 301. In some embodiments, orienting the semiconductor chip 301 based on the directions of incoming energetic radiation particles (e.g., such that a length of the semiconductor chip 301 is parallel or generally parallel with the directions of the incoming energetic radiation particles) may improve the radiation shield effect provided by the solenoid 302 and the accompanying magnetic field.

The foregoing description presents embodiments in which of radiation on semiconductor devices may be reduced or completely removed by creating and artificial magnetic field around the semiconductor chips.

In accordance with common practice, the various features illustrated in the drawings may not be drawn to scale. The illustrations presented in the present disclosure are not meant to be actual views of any particular apparatus (e.g., device, system, etc.) or method, but are merely example representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, it may be recognized that changes may be made in form and detail without departing from the scope of the present disclosure. Thus, the present disclosure is limited only by the claims.

In some embodiments, the different components, modules, engines, and services described herein may be implemented as objects or processes that execute on a computing system (e.g., as separate threads). While some of the systems and processes described herein are generally described as being implemented in software (stored on and/or executed by general purpose hardware), specific hardware implementations or a combination of software and specific hardware implementations are also possible and contemplated.

Terms used in the present disclosure and especially in the appended claims (e.g., bodies of the appended claims) are generally intended as "open terms" (e.g., the term "including" should be interpreted as "including, but not limited to.").

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is expressly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase preceding two or more alternative terms, whether in the description, claims, or drawings, should be understood to contemplate the possibilities of including one of the terms, either of the terms, or both of the terms. For example, the phrase "A or B" should be understood to include the possibilities of "A" or "B" or "A and B."

All examples and conditional language recited in the present disclosure are intended for pedagogical objects to aid the reader in understanding the present disclosure and the concepts contributed by the inventor to furthering the art, and are to be construed as being without limitation to such specifically recited examples and conditions. Although embodiments of the present disclosure have been described in detail, various changes, substitutions, and alterations could be made hereto without departing from the spirit and scope of the present disclosure.

What is claimed is:

1. A semiconductor chip radiation shielding system, comprising:

a computing device including a semiconductor chip;

a voltage supply that is configured to provide a supply voltage; and a solenoid generating a magnetic field that covers the computing device to prevent energetic radiation particles from affecting performance of the semiconductor chip included in the computing device, wherein the supply voltage provided by the voltage supply is applied across the solenoid to pass current through the solenoid, resulting in the solenoid generating the magnetic field around the semiconductor chip.

2. The semiconductor chip radiation shielding system of claim 1, wherein a variable, programmable or adjustable resistor is connected in series with the solenoid to adjust the current passed through the solenoid to decrease or increase a magnitude of the generated magnetic field.

3. The semiconductor chip radiation shielding system of claim 2, wherein:

the magnitude of the generated magnetic field is increased in situations in which a radiation level is high or in situations in which an operation performed in the semiconductor chips is critical; and the current passing through the solenoid may be decreased or turned off when the semiconductor chip is not performing any operations or the operation performed by the semiconductor chip is non-critical.

4. The semiconductor chip radiation shielding system of claim 1, wherein:

a coil of wires surrounding and covering the semiconductor chip is made of a material used to make the computing device to shield the computing device from radiation so that the material also acts a radiation shield in conjunction with the magnetic field the coil of wires is generating; and the coil of wires is made of multiple layers of coiled wires to provide radiation shielding over a full length of the computing device.

5. The semiconductor chip radiation shielding system of claim 1, wherein:

the solenoid is connected in series with the computing device so that the current consumed by the computing device also passes through the solenoid; and the current consumed by the computing device is passed through the solenoid to increase a magnitude of the magnetic field.

6. The semiconductor chip radiation shielding system of claim 5, wherein a filtering circuit is positioned between the solenoid and the computing device to prevent noise and current or voltage spikes from moving from the solenoid to the computing device or vice versa.

7. The semiconductor chip radiation shielding system of claim 6, wherein the filtering circuit is a low-pass filter, a high-pass filter, or a decoupling capacitor.

8. The semiconductor chip radiation shielding system of claim 5, wherein a voltage regulator is positioned between the solenoid and the computing device to regulate the supply voltage being applied to the computing device, the voltage regulator removing noise induced by the solenoid, wherein:

a higher voltage is applied to the solenoid because a lower voltage is not available or to compensate for a voltage drop on the solenoid; and the voltage regulator positioned between the solenoid and the computing device regulates the supply voltage and decreases the supply voltage to a voltage level used by the semiconductor chip of the computing device.

9. The semiconductor chip radiation shielding system of claim 8, wherein two or more voltage regulators are connected to the solenoid in which each of the voltage regulators generates a respective voltage at the voltage level used by the semiconductor chip.

10. The semiconductor chip radiation shielding system of claim 5, wherein a greater supply voltage is applied to the solenoid to compensate for the voltage dropped on the solenoid.

11. The semiconductor chip radiation shielding system of claim 5, wherein the voltage supply connected to the solenoid is a Voltage Drain-to-Drain (VDD) supply configured to provide a high-voltage supply voltage.

12. The semiconductor chip radiation shielding system of claim 5, wherein the voltage supply connected to the solenoid is a Voltage Supply Source (VSS) supply configured to provide a low-voltage supply voltage.

13. The semiconductor chip radiation shielding system of claim 1, wherein two or more semiconductor chips are mounted next to each other or on different sides of a printed circuit board so that the two or more semiconductor chips are shielded from radiation using the solenoid.

14. The semiconductor chip radiation shielding system of claim 1, wherein the solenoid includes a greater number of wire coil turns to generate a larger magnetic field.

15. The semiconductor chip radiation shielding system of claim 1, further comprising a second solenoid oriented in a second orientation direction different from a first orientation direction of the solenoid such that the semiconductor chip of the device is shielded from incoming radiation from the second orientation direction and the first orientation direction.

16. The semiconductor chip radiation shielding system of claim 1, wherein:

the semiconductor chip of the device is located at least partially outside of the solenoid; and the semiconductor chip is partially wrapped within the solenoid and is at least partially oriented in a direction corresponding to an orientation direction of the solenoid.

17. The semiconductor chip radiation shielding system of claim 1, wherein the solenoid is irregular, non-linear, or non-uniform.

18. The semiconductor chip radiation shielding system of claim 1, wherein the semiconductor chip is protected by passive shielding.

* * * * *